United States Patent [19]

Rendulic et al.

[11] Patent Number: 4,702,994
[45] Date of Patent: Oct. 27, 1987

[54] PROJECTION IMAGED RELIEF PRINTING PLATES

[75] Inventors: Francis J. Rendulic, Sudbury; Randolph H. Robinson, Dover; John A. Maccini, Wellesley, all of Mass.

[73] Assignee: W. R. Grace & Co., Cambridge, Mass.

[21] Appl. No.: 873,459

[22] Filed: Jun. 9, 1986

Related U.S. Application Data

[63] Continuation of Ser. No. 656,302, Oct. 1, 1984, abandoned.

[51] Int. Cl.⁴ .......................... G03F 7/10; G03F 7/20
[52] U.S. Cl. .................................. 430/306; 430/325; 430/327; 430/394; 430/396; 430/494; 355/18; 355/27; 355/52; 355/55; 355/77
[58] Field of Search .............. 430/306, 325, 327, 494, 430/396, 394; 355/18, 27, 52, 55, 77

[56] References Cited

U.S. PATENT DOCUMENTS

| | | | |
|---|---|---|---|
| 1,639,738 | 8/1927 | Koppe | 355/85 |
| 1,661,560 | 3/1928 | Carroll | 355/85 |
| 1,789,367 | 1/1931 | Jones | 355/85 |
| 1,831,389 | 11/1931 | Jones | 355/85 |
| 1,914,130 | 6/1933 | Jones | 355/85 |
| 1,923,671 | 8/1933 | Huebner | 95/73 |
| 3,520,606 | 7/1970 | Gush et al. | 355/85 |
| 3,537,853 | 11/1970 | Wessells et al. | 96/35.1 |
| 3,597,080 | 8/1971 | Gush et al. | 355/85 |
| 3,614,225 | 10/1971 | Pinella et al. | 355/85 |
| 3,615,450 | 10/1971 | Werber et al. | 96/35.1 |
| 3,623,879 | 11/1971 | Ketley et al. | 96/115 |
| 3,627,529 | 12/1971 | Frank et al. | 96/33 |
| 3,637,381 | 1/1972 | Hallman et al. | 96/35 |
| 3,645,730 | 2/1972 | Frank et al. | 96/28 |
| 3,650,743 | 3/1972 | Hallman et al. | 96/33 |
| 3,650,746 | 3/1972 | Bailey | 96/35.1 |
| 3,704,125 | 11/1972 | Ketley et al. | 96/14 |
| 3,720,460 | 3/1973 | Wilkinson | 352/198 |
| 3,726,676 | 4/1973 | Ketley et al. | 96/27 |
| 3,730,715 | 5/1973 | Ketley et al. | 96/35.1 |
| 3,734,725 | 5/1973 | Bailey | 96/35.1 |
| 3,773,514 | 11/1973 | Fromson | 96/86 |
| 3,813,162 | 5/1974 | Watabe et al. | 355/85 |
| 3,857,635 | 12/1974 | Niehaus | 355/132 |
| 3,859,091 | 1/1975 | Wessells et al. | 96/36.3 |
| 4,042,996 | 8/1977 | Wessells et al. | 15/306 |
| 4,057,431 | 11/1977 | Finelli et al. | 96/115 |
| 4,120,721 | 10/1978 | Ketley et al. | 96/36.3 |
| 4,137,081 | 1/1979 | Pohl | 96/87 |
| 4,145,790 | 3/1979 | Wessells et al. | 15/306 |
| 4,197,129 | 4/1980 | Wessells et al. | 430/306 |
| 4,197,130 | 4/1980 | Nakamura et al. | 430/286 |
| 4,234,676 | 11/1980 | Hein et al. | 430/286 |
| 4,246,335 | 1/1981 | Keogh et al. | 430/278 |
| 4,358,354 | 11/1982 | Iida et al. | 204/159 |
| 4,428,659 | 1/1984 | Howard | 354/317 |
| 4,498,762 | 12/1985 | Uehara et al. | 355/55 |

FOREIGN PATENT DOCUMENTS

| | | |
|---|---|---|
| 885388 | 11/1971 | Canada . |
| 2119272 | 11/1971 | Fed. Rep. of Germany . |
| 1519013 | 7/1968 | United Kingdom . |
| 1395822 | 5/1975 | United Kingdom . |

OTHER PUBLICATIONS

McDowell et al., "A Review . . . Requirements", *Annual Conference of the Techn. Assoc. of the Graphic Arts*, 5/1979, pp. 1-16.

(List continued on next page.)

*Primary Examiner*—Richard L. Schilling
*Attorney, Agent, or Firm*—Stacey L. Channing; William L. Baker

[57] ABSTRACT

A relief printing plate is made by exposing a photopolymer layer on a support sheet to image forming projected light radiation and then removing the unexposed portions of photopolymer. The image forming projected light radiation is provided by passing ultraviolet light radiation, which has been passed first to homogenizing means and then condensing means, through image bearing means out of contact with said photopolymer layer to a projection enlargement means which projects the resultant image upon the photopolymer layer at a predetermined ratio of enlargement greater than 1:1.

23 Claims, 2 Drawing Figures

OTHER PUBLICATIONS

Richter et al., "Comparing U.V. . . . PCBs", *Circuits Manufacturing*, 11/1979, pp. 69, 117–119.

*Graphic Arts Monthly*, Rachwal Industries, Inc., 9/1982, pp. 42–44.

Projections Newletter, Rachwal Industries, Inc., vol. II, No. 1, 6/1981.

Estabrook, "Projecting . . . Prowess", *Printing Impressions*, 9/1983.

"The Projection Platemaking System for Prepress Automation", Brochure, Rachwal Systems, Inc.

"The Opti-Beam 5000 Photo Exposure Systems", Brochure, Optical Radiation Corp.

"Opti-Beam Advanced Photo Exposure Systems", Brochure, Optical Radiation Corp.

PROJECTION IMAGED RELIEF PRINTING PLATES

This is a continuation of co-pending application Ser. No. 656,302 filed on Oct. 1, 1984, now abandoned.

BACKGROUND OF THE INVENTION

This invention relates to letterpress relief printing plates and a method for making such plates. More particularly, this invention relates to projection imaged letterpress relief printing plates.

In the printing art, time is of the essence. In the past, relief printing plates were usually made by photoengraving and etching a layer of zinc or magnesium metal. However, these methods required relatively long etching periods until sufficient relief was obtained on the metal plate. More recently, the art has disclosed that polymeric materials may be substituted for metal in the formation of printing plates. Modern letter-press printing now commonly utilizes printing plates having photographically produced relief images from photopolymer compositions. The photopolymer composition to be imaged can be a liquid or a solid. In the case of the solid photopolymer, the desired relief image is obtained by exposing the solid photopolymer bonded to a metal or plastic support sheet to light radiation projected through a photographic negative in contact with said solid photopolymer for a sufficient time to insolubilize the photopolymer composition in the image exposed parts. In the case of the liquid photopolymer, the desired relief image is obtained by exposing the liquid photopolymer cast directly on a support sheet to collimated light radiation projected through a photographic negative out of contact with said liquid photopolymer for a sufficient time to substantially cure the photopolymer composition in the image exposed areas. The relief printing plate is then developed by removing from the support sheet portions of photopolymer composition which were unexposed during the image exposure step.

Regardless of whether a liquid photopolymer or a solid photopolymer was used previously to make a relief printing plate, the image was projected through a photographic negative at a ratio of 1:1 with the photopolymer. In other words, the cured image on the photopolymer layer was the same size as the image in the photographic negative. Only with planographic or offset printing plates or printed circuit boards utilizing dry film (all which use a very thin layer of photopolymer) was an image projected through a photographic negative at a ratio greater than 1:1 (the size of the cured image on the photopolymer was greater than the size of the image in the photographic negative). There are many benefits which accrue from projection platemaking at a ratio greater than 1:1, e.g. reduction of material costs, reduction of storage requirements and providing of greater flexibility.

Accordingly, it is a principal object of this invention to provide a system for the projection imaging of letterpress relief printing plates at a projection ratio greater than 1:1.

It is another object of this invention to provide such a system which will drastically reduce materials costs by eliminating the use of full-size photographic film.

It is a further object of this invention to provide such a system which will dramatically reduce storage requirements.

It is a further object of this invention to provide such a system which will provide greater flexibility with regard to using the same roll of film to image different size relief printing plates.

It is yet a further objective of this invention to provide better quality printing plates than those made using conventional processes.

SUMMARY OF THE INVENTION

The instant invention comprises a projection imaged relief printing plate and a method for making such a plate. The projection imaged relief printing plate of the invention is made by: (a) exposing a photopolymer layer on a support sheet to image forming projected light radiation provided by passing ultraviolet light, which has been passed first to homogenizing means and then condensing means, through image bearing means out of contact with said photopolymer layer to a projection enlargement means which projects the resultant image upon the photopolymer layer at a predetermined ratio of enlargement greater than 1:1; and then (b) removing the unexposed portions of photopolymer. If the photopolymer composition is liquid, the liquid containing support sheet is preferably placed in a horizontal position and said layer of liquid photopolymer composition is exposed until said layer is substantially cured in the image exposed areas. If the photopolymer composition is solid, the solid photopolymer is preferably contacted with a cover sheet and said layer of said photopolymer is exposed for a sufficient time to insolubilize the photopolymer composition in the image exposed portions. Preferably, prior to exposing the layer of liquid or solid photopolymer composition to the image forming projected light radiation, said layer of photopolymer composition is exposed to direct actinic radiation for a time period of from about 0.5 seconds to about 20 minutes.

These and other features of the invention will be apparent from the following description of a preferred embodiment and from the drawings.

DESCRIPTION OF THE PREFERRED EMBODIMENT

Figure 1:
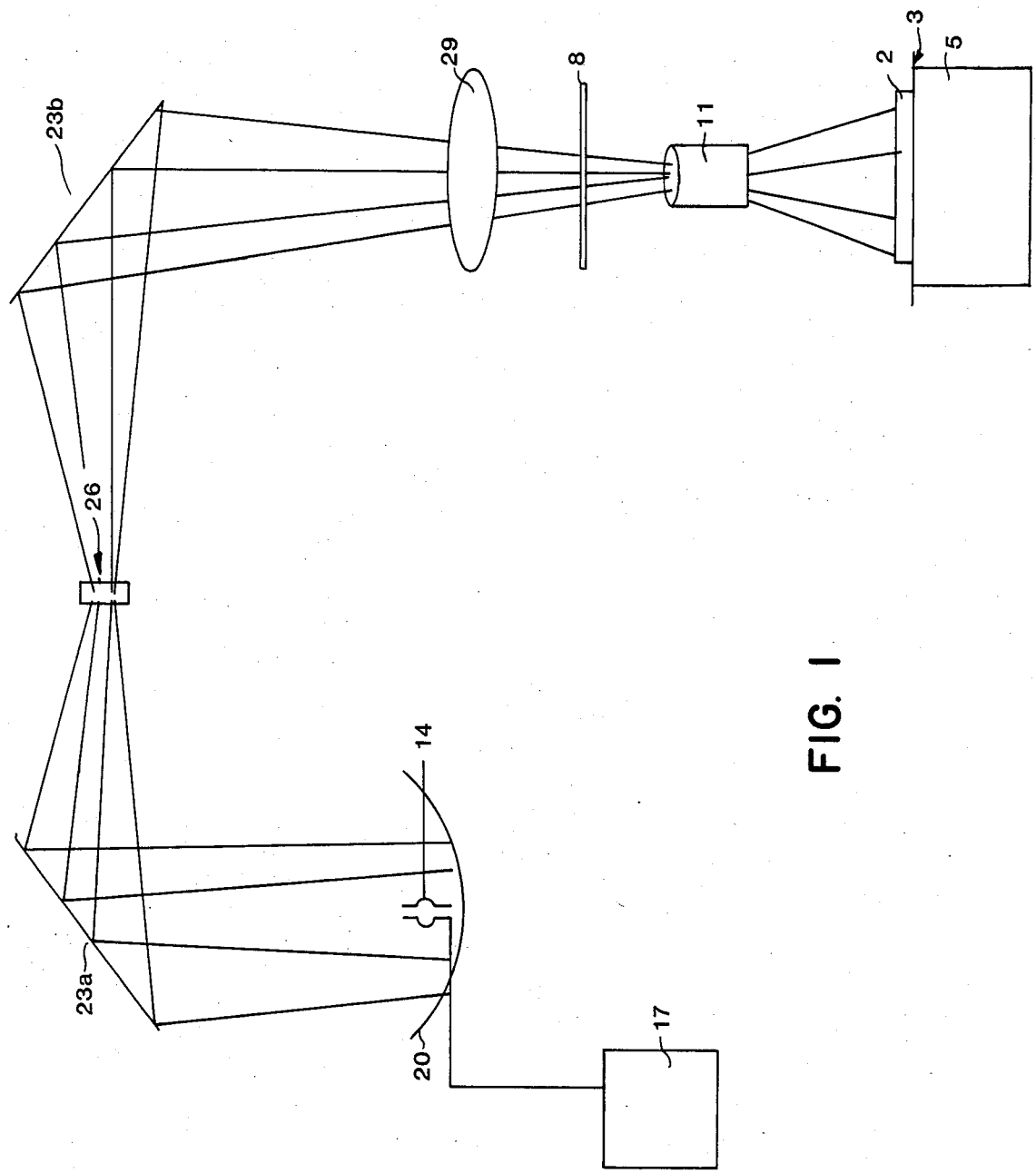
FIG. 1 is a schematic view of a projection imaging system of the invention.

The projection imaged relief printing plate of the present invention is made by exposing a photopolymer layer on a support sheet to image forming projected light radiation and then removing the unexposed portions of polymer. The image forming projected light radiation is provided by passing ultraviolet light radiation, which has been passed first to homogenizing means and then condensing means, through image bearing means out of contact with said photopolymer layer to a projection enlargement means which projects the resultant image upon the photopolymer layer at a predetermined ratio of enlargement greater than 1:1

The nature of the photopolymer is not critical, so long as it will make a letter-press relief plate by providing exposed and unexposed areas. The photopolymer can be a liquid photopolymer or a solid photopolymer (including a liquid photopolymer that has been dried to a solid state). Any liquid photopolymer composition which is curable to a solid using ultraviolet light can be used in this invention. Examples of suitable liquid photopolymer composition which can be used are those taught in U.S. Pat. Nos. 4,358,354, 4,137,081, 4,234,676, 4,057,431 or U.K. Pat. No. 1,519,013, the disclosures of which are incorporated herein by reference. Preferred liquid photopolymer composition for newpaper printing are those set forth in U.S. Pat. No. 4,120,721, the disclosure of which is incorporated herein by reference. One such preferred liquid photopolymer composition comprises:

(1) 10 to 80% by weight of an acrylic or methacrylic terminated, urethane containing polyene;
(2) 5 to 60% by weight of a vinyl monomer diluent;
(3) 0.1 to 35% by weight of a polythiol; and
(4) 0.01 to 10% by weight of a photolnitiator.

Any solid photopolymer composition which can make a letter-press relief plate by providing exposed portions which are insoluble in developer solution and unexposed portions which are soluble in developer solution can be used in this invention. Examples of suitable solid photopolymer compositions which can be used are those taught in U.S. Pat. No. 4,197,130 or U.K. Pat. No. 1,395,822, the disclosures of which are incorporated herein by reference. A preferred solid photopolymer composition is the NAPP solid photopolymer which comprises a copolymer of polyvinyl alcohol and polyvinyl acetate crosslinked with a multifunctional methacrylate or acrylate.

The photopolymer composition of the invention preferably includes a photoinitiator or photosensitizer such as, but not limited to, benzophenone, acetophenone, acenaphthenequinone. o-methoxybenzophenone, anthraquinone, methyl ethyl ketone etc., which serves as a curing rate accelerator. The curing rate accelerator is usually added in an amount ranging from 0.02 to 10% by weight of the photopolymer composition in the instant invention.

A supporting base material, i.e. the support sheet used may be any natural or synthetic product capable of existence in film sheet or plate form and may be flexible or rigid, smooth or matte surface, reflective or non-reflective or actinic light. Metals, because of their greater strength in thinner form, are preferably employed as a support. However, where weight is critical, plastic, paper, or rubber is employed as the support.

Suitable metals for a support sheet include steel, aluminum, magnesium, copper, chromium and the like. Additionally, various film-forming plastics may be used such as addition polymers, vinylidene polymers, the linear condensation polymers such as the polyesters, polyester amides and the like. Fillers or other reinforcing agents may be present in the synthetic resin or polymer support such as various fibers (synthetic, modified or natural). e.g. cellulosic fibers, such as cotton, cellulose acetate, viscose rayon and paper; glass wool; nylon and the like. These reinforced bases may be used in laminated form.

Solid photopolymer is bonded onto the support sheet by lamination, extrusion or other comparable methods. Liquid photopolymer is disposed onto the support sheet by any convenient technique, such as roller coating, dispensing then doctoring as in U.S. Pat. No. 3,597,080, or shape dispensing as in U.S. Pat. No. 4,246,335, the disclosure of which is incorporated herein by reference. The preferred method is that of shape dispensing which comprises simultaneously dispensing and shaping a layer of liquid photopolymer onto a support sheet.

For purposes of producing a suitable relief printing plate, the layer of liquid or solid photopolymer on the support sheet should have a thickness of at least 6 mils and preferably has a thickness of between about 10 to 250 mlls. If the plate is to be used in the manufacture of newspaper, the layer of photopolymer preferably has a thickness of between 10-35 mils; if used for book and business forms, the preferable layer thickness is 17-20 mils; and if used for printed bags and corrugated cardboard boxes, the preferable layer thickness is 30-250 mils.

Prior to image exposing of the layer of photopolymer on the support sheet, the photopolymer sheet is preferably bump exposed (exposed to direct actinic radiation for a brief period of time). The purpose of bump exposing is to reduce cupping or dishing in large relief areas, to increase highlight dot stability, and to reduce overall cure time. If the layer of solid or liquid photopolymer has a thickness of between 10-35 mils, it is preferably bump exposed for between about 0.5 to 4.0 seconds. If the layer of photopolymer has a thickness of between 35-250 mils, it is preferably bump exposed for between about 2 seconds to 20 minutes.

If the photopolymer to be bump exposed is solid, then the photopolymer is preferably contacted with a clear cover sheet prior to bump exposing in order to remove the air at the surface of the plate. A clear plastic film with a thickness of between 1 and 10 mils is a preferred cover sheet. Additionally, if the photopolymer to be bump exposed is solid, there should preferably be about 10 seconds of image exposure for every one second of bump exposure. If the photopolymer to be bump exposed is liquid virgin photopolymer, then the liquid photopolymer should be exposed to direct actinic radiation for no longer than about 90% of the time period in which the photopolymer begins to gel and preferably for no longer than about 80%.

Figure 2:
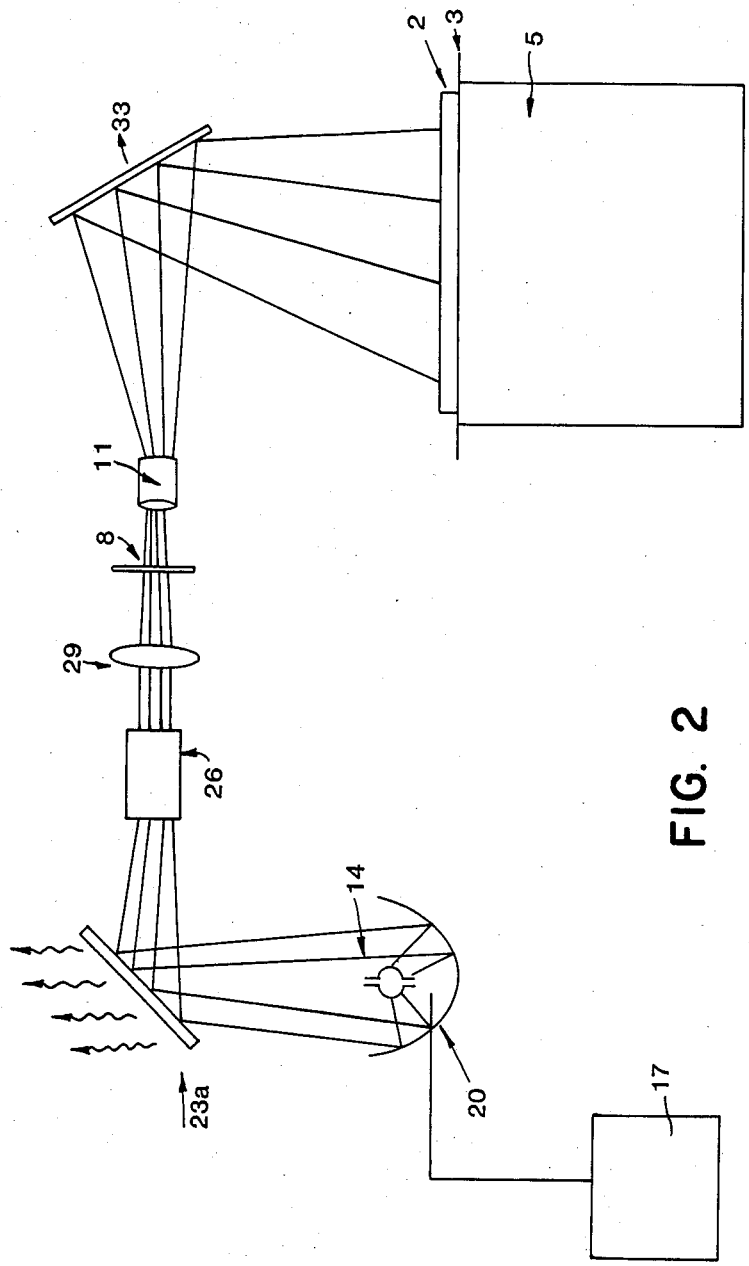
FIG. 2 is a schematic view of another projection imaging system of the invention.

As seen in FIGS. 1 and 2, the photopolymer 2 on a support sheet 3 is preferably placed in a substantially horizontal position on a vacuum table 5, which vacuum table's purpose is to support the photopolymer plate during the step of image exposing. If the photopolymer to be exposed is solid, and the photopolymer was not previously contacted with a cover sheet during the optional bump exposure step, then the photopolymer is preferably contacted with a cover sheet, e.g. a clear plastic film with a thickness of between 1 and 10 mils, prior to image exposing.

In the next step, an image bearing means, preferably a photographic negative 8, is placed in an off-contact relationship with the photopolymer plate. The photographic negative should be virtually free of imperfections and is preferably kept free of dust ect, by conventional means. The image bearing means 8 may be placed parallel to the surface of the photopolymer sheet, as in FIG. 1, or in any other position in which it can later serve to interrupt the light beam, as in FIG. 2. An air gap between the image bearing means and the surface of the photopolymer layer of between about 10 to 75 inches, preferably between about 30 to 75 inches and more preferably between about 33 to 60 inches is maintained. What is meant here by air gap is the distance of the light path from the image bearing means to the photopolymer layer.

The term image bearing means can mean any silver or silverless emulsion. This includes diazo emulsions, laser masks, such as graphite laser masks, etc. This emulsion can be supported on a polymer film, glass, or any other convenient medium. The image bearing means is held in place by mechanical means. If an emulsion on a glass plate or a plastic film is used as the image bearing means, the emulsion side is preferably the side facing or closest to the photopolymer layer.

A projection lens 11 is positioned in such a way that it receives the light beam interrupted by the image bearing means 8 and projects an image upon the photopolymer surface at a predetermined ratio of enlargement greater than 1:1. Any type of lens can be used for said enlarging, whether it be a quartz or glass lens. The preferred lens for the invention ranges from a 20 to 210 mm lens.

After the image bearing means 8 and the projection lens 11, are in place, a light source 14, which is preferably a source of ultraviolet light in the region of 2000 to 5000 Angstroms and which is located to pass light through the image bearing medium, is activated. The power supply pack 17 provides the power for the UV light. The light source 14 may include carbon arcs, mercury arcs, mercury xenon lamps, tungsten halide lamps, and argon glow lamps. Preferably, the light source is a mercury arc or mercury xenon light beam.

The light from the light source 14 is collected by collector 20, (preferably an aspheric electroformed reflector designed to collect the maximum amount of light from the lamp mounted inside) which serves to reflect the light onto dichroic mirror 23a. The purpose of the dichroic mirror is to remove infrared energy from the light source, reflecting usable UV light. From dichroic mirror 23a, the UV light then passes to an optical integrator 26, which serves to homogenize the light (cause the light to be of uniform intensity across the given area). The UV light next goes to either dichroic mirror 23b and then to a condensing lens 29 as in FIG. 1, or directly from the optical integrator 26 to a condensing lens 29 as in FIG. 2, which condensing lens 29 condenses the light (reduces the light beam in size) so it may next pass through the image bearing medium 8 and from there to the projection lens 11 which projects the image upon the photopolymer surface at a predetermined ratio of greater than 1:1 either one or more dichroic mirrors may be used depending on whether a vertical or horizontal light beam is desired. As seen in FIG. 2, the image forming projected light radiation may be bounced off a mirror, e.g. an optical folding mirror 33, onto the photopolymer surface. If the photopolymer is liquid, the photopolymer layer 2 is exposed to image forming projected light radiation until said layer is substantially cured in the image exposed areas. If the photopolymer to be imaged is solid, the photopolymer layer 2 is exposed to image forming projected light radiation for a sufficient time to insolubilize the photopolymer composition in the exposed portions.

The preferred exposure time period for plates with a photopolymer layer thickness of 10-35 mils is between about 20 to 120 seconds. The preferred exposure time period for plates with a photopolymer layer thickness of 35-250 mils is between about 30 seconds and 8 minutes.

After the photopolymer on the support sheet is image exposed, the relief printing plate is developed by removing from the support sheet portions of photopolymer composition which were unexposed. Before development, the cover sheet, if any, is removed from the image exposed photopolymer. Development can be carried out by conventional means, e.g. removal of the unexposed portions with a suitable solvent (solvent etching) or liquid therefor (aqueous etching). Additionally, if the unexposed portions are uncured liquid portions, they may be removed by an air knive, i.e. a mechanical apparatus which travels across the plate emitting a stream of pressurized gas sufficient to remove the substantially uncured portions of photopolymer composition by pushing the substantially uncured portions ahead of the gas stream. Thereafter, the developed relief printing plate is preferably postexposed to direct actinic radiation for a period of between about 20-90 seconds and then is ready for use in printing.

The invention is further disclosed by the following non-limiting examples.

EXAMPLE 1

PRIOR ART

A liquid photopolymer (sold under the trade name LETTERFLEX Y obtained from W. R. Grace & Co.) is shape dispensed to a thickness of 20-22 mils to steel platebacking and bump exposed in a LETTERFLEX LF-135 exposure tower, obtained from W. R. Grace & Co., with bump exposure set at 80% of gel point. The bump exposed plate is then placed on a vacuum table in a horizontal position approxiamtely 0.015 inch below the plane of an image bearing negative. The bump exposed plate is then exposed for 60 seconds to ultraviolet light with a power supply of 8 KW which is projected through the image bearing negative at a ratio of 1:1 with the photopolymer. The plate is then developed by using a LETTERFLEX-135 air knive processer (obtained from W. R. Grace & Co.) to remove substantially uncured portions of polymer from the plate.

EXAMPLE 2

A liquid photopolymer, (sold under the trade name LETTERFLEX Y obtained from W. R. Grace & Co.) was shape dispensed to a thickness of 21 mils to steel platebacking and bump exposed in a LETTERFLEX LF-135 exposure tower, obtained from W. R. Grace & Co., with bump exposure set at 80% of gel point. The bump exposed plate was then placed on a vacuum table in a horizontal position approximately 59 inches below the plane of an image bearing 105 mm film negative. The bump exposed plate was then exposed for 60 seconds to image forming projected light radiation provided by passing ultraviolet light radiation (provided by Optical Radiation Corporation's mercury xenon light with a power supply of 1.6 KW), which has been passed through an optical integrator and a condensing lens, through the image bearing negative to a 210 mm projection lens which projected the resultant image upon the photopolymer layer at a 5X ratio of enlargement. The plate was then developed by using a LETTERFLEX-135 air knife processor (obtained from W. R. Grace & Co.) to remove from the plate substantially uncured portions of polymer.

The thus formed plate was mounted on a newspaper printing press and printing was carried out. The printing results obtained were comparable to those which can be produced by conventional means as in Example 1. Even though the projection enlargement system of Example 2 used a much lower power supply than that of Example 1 (1.6 KW vs 8 KW) and there was a much greater distance between the image bearing means and the plate (59 inches vs 0.015 inch), the image exposure time required in the projection enlargement system of Example 2 was still only 60 seconds, the same as that which is required in the comparative prior art Example 1.

EXAMPLE 3

The procedure of Example 2 was repeated except 70 mm film was used, a 105 mm lens was used, and the UV light was projected at a 7.25 ratio of enlargement. The resulting plate was comparable to the plate of Example 2.

EXAMPLE 4

The procedures of both Example 2 and Example 3 were repeated except the power supply to the UV lamp was reduced to 1.0 KW, thus necessitating an increase in projection exposure time of approximately 10–15% for a total of about 67 seconds. Plates were produced which were comparable to the plates of Example 2 except that there was a problem of dot recession.

EXAMPLE 5

A commercially available solid photopolymer plate, manufactured by NAPP System (USA) Inc., San Marcos, Ca (Napplate) with a photopolymer thickness of approximately 20 mils was bump exposed in a LETTERFLEX LF-135 exposure tower for 3 seconds. The bump exposed plate was then placed on a vacuum table in a horizontal position approximately 59 inches below the plane of an image hearing 105 mm film negative. The bump exposed plate was projection imaged as in Example 2. The image exposed plate was then developed in an aqueous rotary spray washout distributed by Hercules Corporation. Aqueous etchant used was 16C manufactured by LETTERFLEX Systems, obtainable from W. R. Grace & Co. The plate was then hot air dried and post exposed to an ultraviolet source for 60 seconds.

EXAMPLE 6

The procedure of Example 5 was repeated except the photopolymer plate was contacted with a 2.5 mil clear plastic film during the bump and projection exposure steps to evaluate the effect of removing the air at the surface of the plate. The plastic film was removed after projection exposure and the plate was then processed as in Example 5.

A better plate was produced than that of Example 5, i.e. more fine lines and better fine dot holding ability.

While this invention has been described with reference to its preferred embodiment, other embodiments can achieve the same result. Variations and modifications of the present invention will be obvious to those skilled in the art and it is intended to cover in the appended claims all such modifications and equivalents as fall within the true spirit and scope of this invention.

We claim:

1. A method for making a relief printing plate comprising the steps of:
   (a) providing a layer of photopolymer composition on a support sheet;
   (b) exposing the photopolymer layer to image forming projected light radiation provided by passing light radiation, which has been passed first to homogenizing means and then condensing means, through image bearing means out of contact with said photopolymer layer to a projection enlargement means which projects the resultant image upon the photopolymer layer at a predetermined ratio of enlargement greater than 1:1; and
   (c) developing the relief printing plate by removing from the support sheet portions of photopolymer composition which were unexposed during the image exposure step b.

2. The method of claim 1 wherein in step a the photopolymer composition is liquid and said layer of liquid photopolymer composition is exposed in step b until said layer is substantially cured in the image exposed areas.

3. The method of claim 2 wherein prior to exposing said layer of liquid photopolymer composition in step b, the liquid containing support sheet is placed in a substantially horizontal position.

4. The method of claim 1 wherein in step a the photopolymer composition is solid and said layer of solid photopolymer is exposed in step b for a sufficient time to insolubilize the photopolymer composition in the exposed portions.

5. The method of claim 1 wherein the layer of photopolymer has a thickness of at least 6 mils.

6. The method of claim 1 wherein the layer of photopolymer has a thickness of between about 10 to 35 mils.

7. The method of claim 6 wherein prior to step b, said layer of photopolymer composition is exposed to direct actinic radiation for a time period of from about 0.5 to about 4.0 seconds.

8. The method of claim 2 wherein prior to step b, said layer of liquid photopolymer composition is exposed to direct actinic radiation for no longer than about 90% of the time period in which the photopolymer begins to gel.

9. The method of claim 8 wherein said layer of liquid photopolymer composition is exposed to direct actinic radiation for no longer than about 80% of the time period in which the photopolymer begins to gel.

10. The method of claim 2 wherein the liquid photopolymer composition comprises:
    (1) 10 to 80% by weight of an acrylic or methacrylic terminated, urethane containing polyene,
    (2) 5 to 60% by weight of a non-water soluble vinyl monomer diluent,
    (3) 0.1 to 35% by weight of a polythiol and
    (4) 0.01 to 10% by weight of a photoinitiator.

11. The method of claim 1 wherein the image bearing means comprises a photographic negative.

12. The method of claim 1 wherein the image bearing means comprises a laser mask.

13. The method of claim 1 wherein the light radiation comprises ultraviolet light radiation.

14. The method of claim 1 wherein the homogenizing means comprises an optical integrator.

15. The method of claim 1 wherein the condensing means comprises a condensing lens.

16. The method of claim 2 wherein in step a, the liquid photopolymer layer is shape dispensed onto the support sheet.

17. The method of claim 2 wherein in step c, the relief printing plate is exposed to a stream of gas under pressure sufficient to remove the substantially uncured portions of photopolymer composition by pushing the substantially uncured portions ahead of the gas stream.

18. The method of claim 4 wherein the unexposed portions of photopolymer composition are removed by aqueous etching.

19. The method of claim 4 wherein prior to step b, the solid photopolymer composition is contacted with a cover sheet which is removed after image exposure step b.

20. The method of claim 19 wherein the cover sheet comprises a clear plastic film with a thickness of between 1 and 10 mils.

21. The method of claim 1 wherein an air gap of about 10 to 75 inches is maintained between the image bearing means and the photopolymer layer.

22. A method for making a relief printing plate comprising the steps of:
(a) disposing a layer of liquid photopolymer composition onto a support sheet;
(b) placing said liquid containing support sheet in a substantially horizontal position;
(c) exposing the liquid photopolymer layer to image forming projected light radiation provided by passing light radiation. which has been passed first to homogenizing means and then condensing means, through image bearing means out of contact with said photopolymer layer to a projection enlargement means which projects the resultant image upon the photopolymer layer at a predetermined ratio of enlargement greater than 1:1; and
(d) developing the relief printing plate by removing from said support sheet the substantially uncured liquid photopolymer which was unexposed during said image exposure step c.

23. The method of claim 22 wherein the layer of liquid photopolymer has a thickness of at least 6 mils.

* * * * *